(12) United States Patent
Inoue

(10) Patent No.: US 9,117,525 B2
(45) Date of Patent: Aug. 25, 2015

(54) NONVOLATILE SEMICONDUCTOR MEMORY DEVICE AND METHOD OF MANUFACTURING THE SAME

(71) Applicant: KABUSHIKI KAISHA TOSHIBA, Tokyo (JP)

(72) Inventor: Satoshi Inoue, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 178 days.

(21) Appl. No.: 13/785,501

(22) Filed: Mar. 5, 2013

(65) Prior Publication Data

US 2014/0071762 A1 Mar. 13, 2014

Related U.S. Application Data

(60) Provisional application No. 61/699,900, filed on Sep. 12, 2012.

(51) Int. Cl.

| | | |
|---|---|---|
| *G11C 11/34* | (2006.01) | |
| *G11C 16/04* | (2006.01) | |
| *H01L 29/788* | (2006.01) | |
| *H01L 29/66* | (2006.01) | |
| *H01L 27/115* | (2006.01) | |
| *G11C 29/50* | (2006.01) | |
| *H01L 23/525* | (2006.01) | |
| *G11C 29/04* | (2006.01) | |

(52) U.S. Cl.
CPC ...... *G11C 16/0408* (2013.01); *G11C 29/50004* (2013.01); *H01L 27/11524* (2013.01); *H01L 29/66825* (2013.01); *H01L 29/788* (2013.01); *H01L 29/7881* (2013.01); *G11C 2029/0403* (2013.01); *H01L 23/5252* (2013.01)

(58) Field of Classification Search
CPC .................. G11C 16/0408; H01L 29/788
USPC ............... 365/185.01, 185.18; 257/316, 317
See application file for complete search history.

(56) References Cited

U.S. PATENT DOCUMENTS

| 4,381,591 A * | 5/1983 | Barger et al. ............. 29/890.124 |
| 7,061,737 B2 * | 6/2006 | Chen ............................ 361/91.1 |
| 7,064,379 B2 * | 6/2006 | Kutsukake et al. ........... 257/315 |

(Continued)

FOREIGN PATENT DOCUMENTS

| JP | 2003-203999 | 7/2003 |
| JP | 2005-44844 | 2/2005 |

(Continued)

*Primary Examiner* — Viet Q Nguyen
(74) *Attorney, Agent, or Firm* — Oblon, McClelland, Maier & Neustadt, L.L.P.

(57) ABSTRACT

According to one embodiment, a nonvolatile semiconductor memory device includes a memory cell and a select gate transistor formed on a semiconductor substrate. The memory cell includes a first gate insulating film, a first charge storage layer, a first intergate insulating film, and a first control gate. The first gate insulating film, the first charge storage layer, the first intergate insulating film, and the first control gate are formed on the semiconductor substrate in order. The select gate transistor includes a second gate insulating film, a first gate electrode, a second intergate insulating film, and a second control gate. The second gate insulating film, the first gate electrode, the second intergate insulating film, and the second control gate are formed on the semiconductor substrate in order. The second intergate insulating film different first and second thicknesses.

13 Claims, 8 Drawing Sheets

(56) References Cited

U.S. PATENT DOCUMENTS

| | | | |
|---|---|---|---|
| 7,078,763 B2* | 7/2006 | Arai et al. | 257/320 |
| 8,093,647 B2* | 1/2012 | Sato et al. | 257/316 |
| 8,168,493 B2* | 5/2012 | Kim | 438/238 |
| 8,378,432 B2* | 2/2013 | Carter et al. | 257/410 |
| 8,815,726 B2* | 8/2014 | Miyagawa | 438/585 |
| 8,912,588 B2* | 12/2014 | Kanda | 257/316 |
| 2003/0127681 A1 | 7/2003 | Nishioka et al. | |
| 2005/0045941 A1 | 3/2005 | Kurita et al. | |
| 2008/0316796 A1 | 12/2008 | Herner | |
| 2009/0014708 A1 | 1/2009 | Sasago et al. | |
| 2009/0278188 A1 | 11/2009 | Asami | |

FOREIGN PATENT DOCUMENTS

| | | |
|---|---|---|
| JP | 2009-21436 | 1/2009 |
| JP | 2009-295971 | 12/2009 |
| JP | 2010-531543 | 9/2010 |

* cited by examiner

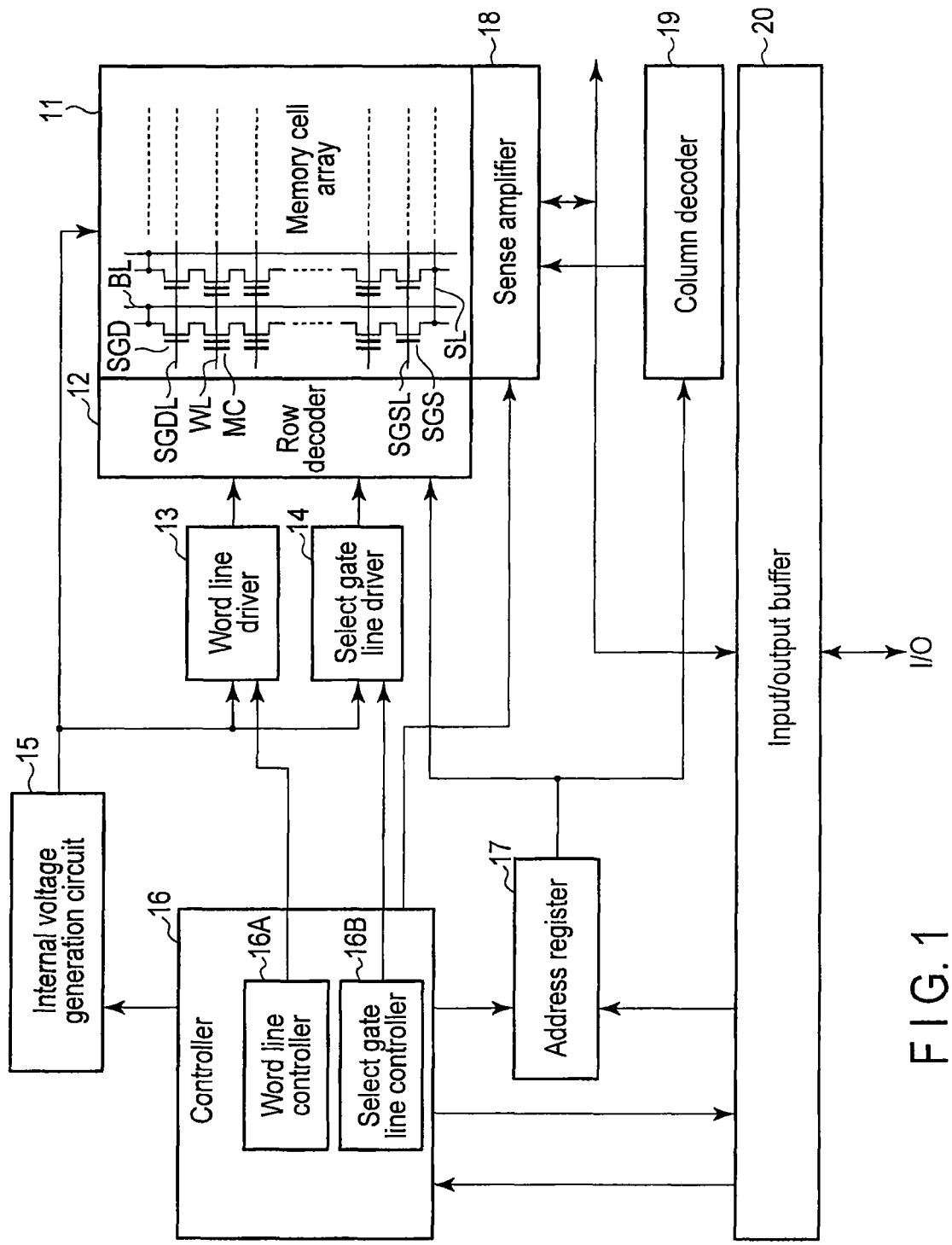
F I G. 1

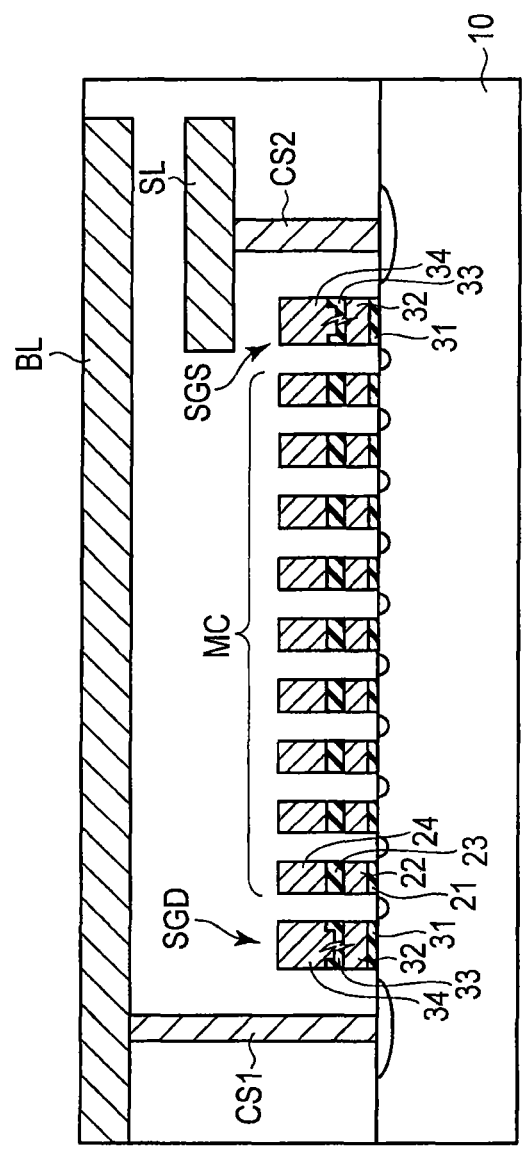
F I G. 2

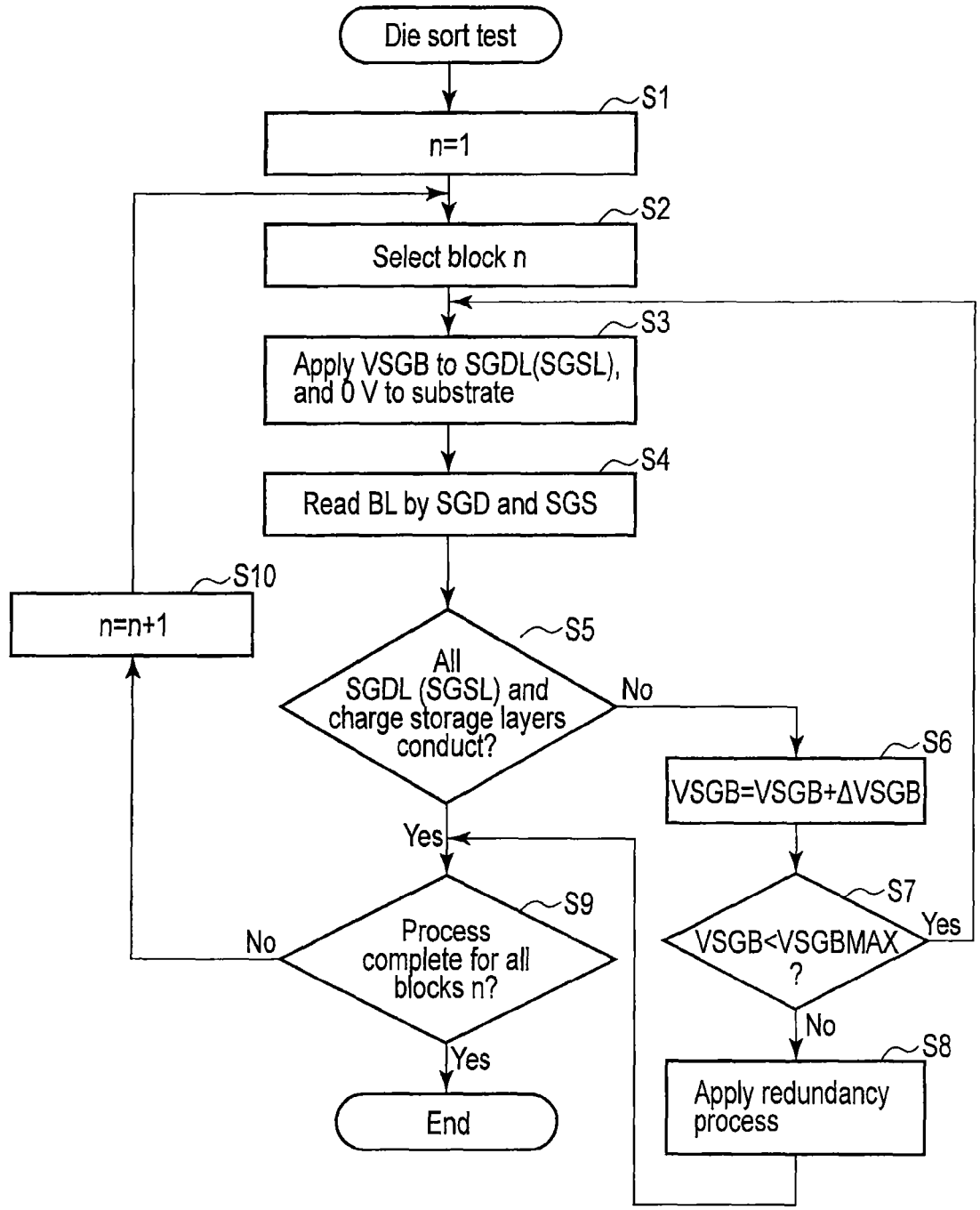
F I G. 5

NONVOLATILE SEMICONDUCTOR MEMORY DEVICE AND METHOD OF MANUFACTURING THE SAME

CROSS-REFERENCE TO RELATED APPLICATIONS

This application claims the benefit of U.S. Provisional Application No. 61/699,900, filed Sep. 12, 2012, the entire contents of which are incorporated herein by reference.

FIELD

Embodiments described herein relate generally to a nonvolatile semiconductor memory device having a charge storage layer as a memory cell, and a method of manufacturing the same.

BACKGROUND

In a nonvolatile semiconductor memory device such as a NAND-type flash memory, a select gate transistor is used to select a block for writing or reading. As this select gate transistor is built into a memory cell array in the same manner as a memory cell, its section has a structure similar to that of the memory cell and comprises a charge storage layer such as a floating gate, an intergate insulating film, and a control gate that are stacked.

In order for the select gate transistor to operate as a MOS transistor, it is necessary to open a part of the intergate insulating film in the same manner as the MOS transistor of a peripheral circuit, and electrically connect the control gate to the charge storage layer.

However, if the aspect ratio of the charge storage layer is low, the charge storage layer may be overetched or even a tunnel oxide film under the charge storage layer may be etched in the process of opening (for example, reactive ion etching) the intergate insulating film.

BRIEF DESCRIPTION OF THE DRAWINGS

FIG. 1 is a block diagram showing the configuration of a nonvolatile semiconductor memory device according to a first embodiment;

FIG. 2 is a sectional view showing the structure of a memory cell array according to the first embodiment;

FIG. 5 is a flowchart of a die sort test according to the first embodiment;

DETAILED DESCRIPTION

Figure 3:
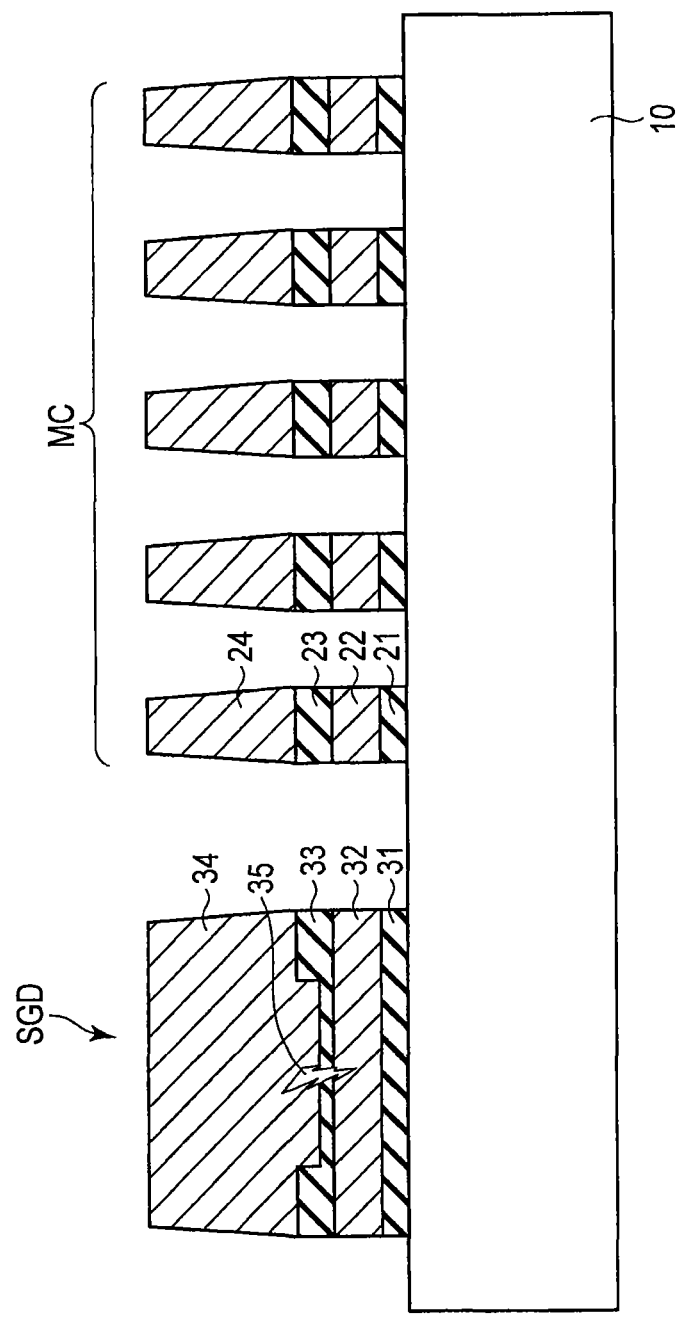
FIG. 3 is a partially enlarged sectional view of the memory cell array according to the first embodiment.

A nonvolatile semiconductor memory device according to an embodiment will hereinafter be described with reference to the drawings. Here, a NAND-type flash memory is shown as an example of the nonvolatile semiconductor memory device. Components having the same function and configuration are provided with the same reference signs throughout the following explanations and are repeatedly described only when necessary.

In general, according to one embodiment, a nonvolatile semiconductor memory device includes a memory cell formed on a semiconductor substrate, and a select gate transistor formed on the semiconductor substrate. The memory cell includes a first gate insulating film, a first charge storage layer, a first intergate insulating film, and a first control gate. The first gate insulating film is formed on the semiconductor substrate. The first charge storage layer is formed on the first gate insulating film. The first intergate insulating film is formed on the first charge storage layer. The first control gate is formed on the first intergate insulating film. The select gate transistor includes a second gate insulating film, a first gate electrode, a second intergate insulating film, and a second control gate. The second gate insulating film is formed on the semiconductor substrate. The first gate electrode is formed on the second gate insulating film. The second intergate insulating film is formed on the first gate electrode, and has different first and second thicknesses. The second control gate is formed on the second intergate insulating film.

First Embodiment

FIG. 1 is a block diagram showing the configuration of a NAND-type flash memory according to the first embodiment.

As shown in FIG. 1, the NAND-type flash memory includes a memory cell array 11, a row decoder 12, a word line driver 13, a select gate line driver 14, an internal voltage generation circuit (booster circuit) 15, a controller 16, an address register 17, a sense amplifier 18, a column decoder 19, and an input/output buffer 20. The controller 16 includes a word line controller 16A and a select gate line controller 16B.

The memory cell array 11 has a plurality of blocks in which a plurality of memory cells are arrayed in matrix form. The block in the memory cell array 11 has a plurality of NAND cell units. The NAND cell unit has a plurality of memory cells MC connected in series, and a drain side select gate transistor SGD and a source side select gate transistor SGS connected to both ends of the memory cells MC.

The memory cell MC includes a nonvolatile memory cell transistor including a charge storage layer and a control gate. One end of the NAND cell unit is connected to a bit line BL via the select gate transistor SGD, and the other end of the NAND cell unit is connected to a common source line SL via the select gate transistor SGS.

The control gates of the memory cells MC in the same row are connected to a word line WL. Select gate lines SGDL and SGSL are connected to the control gates of the select gate transistors SGD and SGS, respectively.

A row decoder 12 is disposed at the end of the memory cell array 11 in a word line direction. The word line driver 13 for driving the word line WL and the select gate line driver 14 for driving the select gate lines SGDL and SGSL are connected to the row decoder 12. The word line controller 16A is connected to the word line driver 13, and the select gate line controller 16B is connected to the select gate line driver 14.

The row decoder 12 selects a particular block from among the blocks in the memory cell array 11 in accordance with an address. In other words, the row decoder 12 selects a word line in a particular block from among a plurality of word lines in accordance with an address.

The internal voltage generation circuit 15 is connected to the memory cell array 11, the word line driver 13, and the select gate line driver 14. The internal voltage generation circuit 15 increases an externally supplied voltage, and generates a predetermined voltage.

The sense amplifier 18 is disposed at the (lower) end of the memory cell array 11 in a bit line direction. The column decoder 19 and the input/output buffer 20 are connected to the sense amplifier 18. The sense amplifier 18 senses and amplifies data read into the bit line from the memory cell MC. The column decoder 19 selects a particular bit line from among a plurality of bit lines connected to the memory cell MC in the memory cell array 11 in accordance with an address.

The word line controller 16A controls the word line driver 13, and the select gate line controller 16B controls the select gate line driver 14. The controller 16 controls the operations of the sense amplifier 18, the internal voltage generation circuit 15, the address register 17, and the input/output buffer 20.

FIG. 2 is a sectional view showing the structure of the memory cell array 11. A section along the bit line direction is shown. FIG. 3 is an enlarged view of the select gate transistor and the memory cells in the memory cell array 11. In FIG. 3, a flat cell having a flat charge storage layer is shown as the memory cell. The charge storage layer of the flat cell is, for example, about several nm to 20 nm in height and about several nm to several ten nm in width.

As shown in FIG. 2, the memory cells MC connected in series are arrayed on a semiconductor substrate 10. One end of the current path of the select gate transistor SGD is connected to one end of the memory cells MC. One end of the current path of the select gate transistor SGS is connected to the other end of the memory cells MC.

The bit line BL is connected to other end of the current path of the select gate transistor SGD via a contact plug CS1. The source line SL is connected to other end of the current path of the select gate transistor SGS via a contact plug CS2.

The memory cell MC has the following structure. As shown in FIGS. 2 and 3, a tunnel insulating film 21 as a gate insulating film is formed on the semiconductor substrate 10, and a charge storage layer 22 is formed on the tunnel insulating film 21. An intergate insulating film 23 is formed on the charge storage layer 22, and a control gate (word line WL) 24 is formed on the intergate insulating film 23.

The select gate transistor SGD has the following structure. As shown in FIGS. 2 and 3, a gate insulating film 31 is formed on the semiconductor substrate 10, a charge storage layer 32 is formed on the gate insulating film 31. An intergate insulating film 33 is formed on the charge storage layer 32, and a control gate (select gate line SGDL) 34 is formed on the intergate insulating film 33.

The select gate transistor SGS has the following structure. As shown in FIGS. 2 and 3, a gate insulating film 31 is formed on the semiconductor substrate 10, and a charge storage layer 32 is formed on the gate insulating film 31. An intergate insulating film 33 is formed on the charge storage layer 32, and a control gate (select gate line SGSL) 34 is formed on the intergate insulating film 33.

Now, how to electrically connect the control gate 34 and the charge storage layer 32 in a method of manufacturing the select gate transistors SGD and SGS is described.

As described above, the select gate transistor is built into the memory cell array in the same manner as the memory cell, so that its section has a structure similar to that of the memory cell. In order for the select gate transistor to operate as a MOS transistor, it is necessary to open a part of the intergate insulating film, and electrically connect the control gate to the charge storage layer.

The intergate insulating film 33 of the select gate transistor SGD (SGS) is made of the same material as the intergate insulating film 23 between the control gate and the charge storage layer of the memory cell MC, and has substantially the same thickness. These intergate insulating films are generally formed by stacking a plurality of insulating films (mainly high-dielectric-constant films) to raise the coupling ratio of the memory cell and improve writing characteristics.

Among the stacked films that constitute the intergate insulating film 33, a first insulating film 33A formed closest to the charge storage layer 32 or a second insulating film 33B second closest to the charge storage layer 32 is etched by using conditions with high etching selectivity, that is, etched by using conditions in which the first insulating film 33A or the second insulating film 33B are not easily etched. Thereby, the intergate insulating film 33 is opened up to a point located several nm apart from the charge storage layer 32. The control gate 34 is then formed to fill the opening. Thus, the thickness of the intergate insulating film 33 in the opening becomes about several nm, and dielectric strength voltage becomes extremely low.

If a potential difference at a given level or more is applied across the control gate 34 and the charge storage layer 32 in this condition, the intergate insulating film 33 is easily broken down, and a conductive path 35 is formed between the control gate 34 and the charge storage layer 32. As a result, the control gate 34 and the charge storage layer 32 become electrically continuous.

A method of manufacturing the select gate transistor in the NAND-type flash memory is described below with reference to FIGS. 4A to 4E.

Figures 4A, 4B, 4C, 4D, 4E:
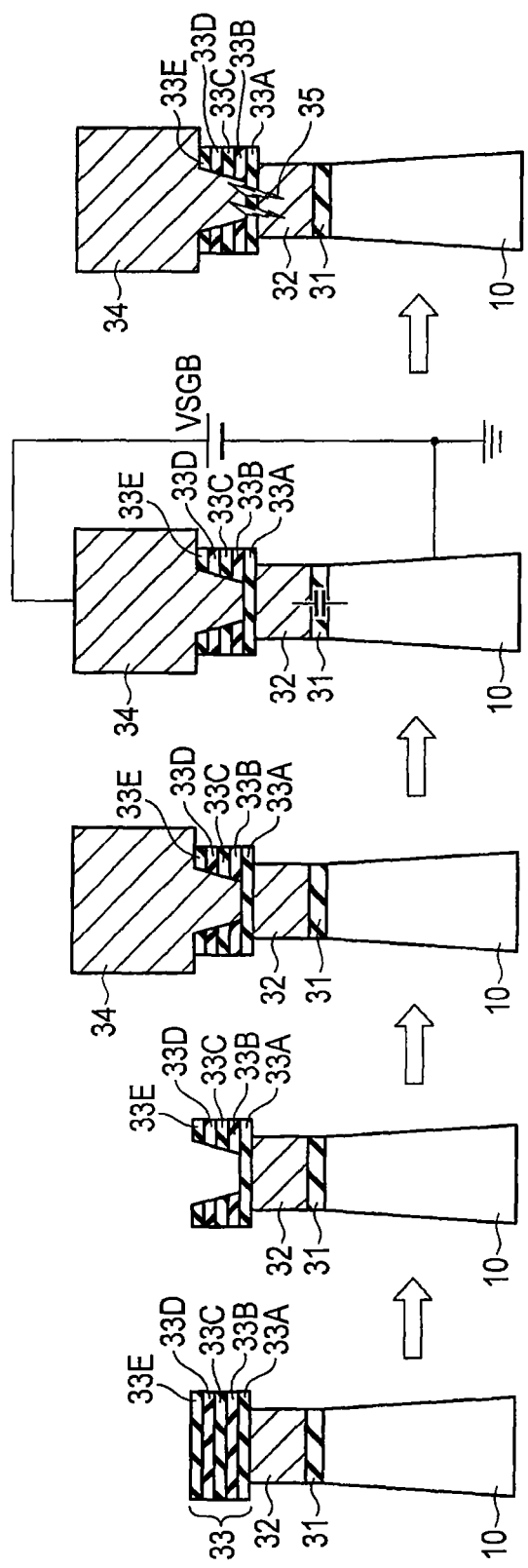
FIGS. 4A to 4E are sectional views showing a method of manufacturing a select gate transistor according to the first embodiment.

First, as shown in FIG. 4A, a structure in which the gate insulating film 31, the charge storage layer 32, and the intergate insulating film 33 are disposed on the semiconductor substrate 10 is formed. The charge storage layer 32 is made of, for example, a polysilicon film. The intergate insulating film 33 on the charge storage layer 32 is made up of, for example, five stacked films. These stacked films include the first insulating film 33A, the second insulating film 33B, a third insulating film 33C, a fourth insulating film 33D, and a fifth insulating film 33E stacked in that order on the charge storage layer 32.

The first insulating film 33A is made of, for example, a silicon oxide or a silicon nitride. The second insulating film 33B is made of, for example, a silicon nitride. Each of the third, fourth, and fifth insulating films 33C, 33D, and 33E is made of, for example, one of a silicon oxide, a hafnium oxide, and an aluminum oxide.

As shown in FIG. 4B, a part of the intergate insulating film 33 on the charge storage layer 32 is then etched, and a trench is formed in the intergate insulating film 33. The etching to form this trench is stopped at the surface of the first insulating film (for example, silicon nitride film) 33A. Thus, the first insulating film 33A is only left between the bottom of the trench and the charge storage layer 32.

Although the first insulating film 33A is only left on the charge storage layer 32 here, two insulating films, i.e., the first insulating film 33A and the second insulating film 33B may be left. If the two insulating films are left, the second insulating film 33B is made of, for example, a silicon nitride. The first insulating film 33A is made of, for example, a silicon oxide or a silicon nitride.

As shown in FIG. 4C, the control gate 34 is then formed on the intergate insulating film 33 and on the trench. As shown in FIG. 4D, a breakdown voltage VSGB is then applied across the control gate 34 and the semiconductor substrate 10. As shown in FIG. 4E, the first insulating film 33A between the control gate 34 and the charge storage layer 32 is dielectrically broken down by the breakdown voltage VSGB, and the conductive path 35 is formed between the control gate 34 and the charge storage layer 32.

Now, a die sort test to form the conductive path between the control gate (34) SGDL (SGSL) and the charge storage layer 32 of the select gate transistor SGD (SGS) is described. This test may be performed by the controller 16, or may be performed by installing a program from an external tester. Otherwise, this test may be performed by a control unit such as a computer.

FIG. 5 is a flowchart of the die sort test according to the first embodiment.

First, n is set to 1 to select a block 1 at the time of die sorting (steps S1 and S2). The breakdown voltage VSGB (for example, a pulse voltage of 5 V) for breaking down the intergate insulating film is then applied to the control gate SGDL (SGSL) of the select gate transistor SGD (SGS) in the block 1, and a voltage of zero is applied to the semiconductor substrate (well) 10 (step S3). In this case, if the coupling ratio between the control gate SGDL (SGSL) and the charge storage layer 32 of the select gate transistor SGD (SGS) is, for example, 0.5, a potential difference of 2.5 V is produced between the control gate SGDL (SGSL) and the charge storage layer 32. If this potential difference is of a magnitude that can cause the intergate insulating film (first insulating film 33A) to break down, the intergate insulating film between the control gate SGDL (SGSL) and the charge storage layer dielectrically breaks down, and the control gate SGDL (SGSL) and the charge storage layer 32 become electrically continuous.

It is then determined whether the control gates SGDL (SGSL) and the charge storage layers 32 of all the select gate transistors SGD (SGS) in the block 1 are electrically continuous.

First, a voltage (for example, Vread) sufficient to switch on the memory cells MC is applied to all the word lines WL in the block 1. The bit lines BL are precharged to a power supply voltage VDD. A voltage (for example, the power supply voltage VDD) that only switches on the select gate transistors SGD and SGS in which the control gate and the charge storage layer conduct and that does not switch on the select gate transistors SGD and SGS which fail to conduct and so increase their voltages because of coupling is then applied to the control gates SGDL and SGSL.

As a result, the potential only drops in the bit line BL connected to the select gate transistors in which both the control gates SGDL and SGSL are electrically connected to the charge storage layers. By detecting the drop in potential of this bit line, it is possible to ascertain that the control gates SGDL and SGSL and the charge storage layer are electrically continuous (step S4). This is equivalent to normally reading the select gate transistors SGD and SGS.

In this way, whether the control gates SGDL (SGSL) and the charge storage layers mutually conduct is determined for all the select gate transistors SGD (SGS) in the block 1 (step S5).

If a select gate transistor SGD (SGS) whose control gate and charge storage layer do not conduct exists, the breakdown voltage VSGB to be applied to its control gate SGDL (SGSL) is increased, that is, stepped up by ΔVSGB (step S6). For example, if ΔVSGB is 0.5 V, the breakdown voltage VSGB is set to 5.5 V.

It is then determined whether the breakdown voltage VSGB to be applied to the control gate SGDL (SGSL) is lower than an allowable maximum voltage (step S7). When the control gate and the charge storage layer are electrically continuous, the control gate SGDL (SGSL) and the charge storage layer 32 are at the same potential, and a large potential difference is produced between the charge storage layer 32 and the semiconductor substrate 10 (in the above example, the potential difference is 5.5 V because a voltage of 5.5 V is applied to the control gate SGDL and a voltage of zero is applied to the well). The maximum breakdown voltage VSGB that can be applied to the control gate SGDL (SGSL) is determined so that the potential difference will not cause the gate insulating film (for example, tunnel oxide film) 31 to break down.

When the breakdown voltage VSGB is lower than the maximum voltage in step S7, the procedure returns to step S3, and the above-described processes in steps S3 to S7 are repeated. That is, the breakdown voltage VSGB is applied to the control gate SGDL (SGSL), and the bit line BL connected to the select gate transistor is read. Thus, whether the control gates and the charge storage layers mutually conduct is determined for all the select gate transistors in the block 1. When the control gates and the charge storage layers do not conduct, the breakdown voltage VSGB is stepped up to the maximum voltage or more, and then the above-described processes in steps S3 to S7 are repeated.

On the other hand, if the breakdown voltage VSGB is greater than or equal to the maximum voltage in step S7, it is determined that the control gate SGDL (SGSL) and the charge storage layer 32 of the select gate transistor SGD (SGS) in this case cannot conduct. The select gate transistor and the bit line BL connected to the select gate transistor are then regarded as defective, and a redundancy process is applied thereto. That is, the bit line BL connected to the select gate transistor is replaced by a spare bit line BL. Otherwise, when the number of defective bit lines BL is great, this block is replaced by a spare block (step S8). The procedure then moves to step S9.

When it is ascertained in step S5 that the control gates SGDL (SGSL) and the charge storage layers of all the select gate transistors SGD (SGS) conduct, the procedure moves to step S9. Thus, the process for the block 1 ends.

It is then determined in step S9 whether the above-described process has been completed for all the blocks. If the process for all the blocks has not been completed, n is incremented (step S10), and the procedure returns to step S2. On the other hand, if the process for all the blocks has been completed, the process ends.

As a result of the die sort test described above, a conductive path is formed between the control gate and the charge storage layer in the select gate transistor, and whether the conductive path is formed can be determined.

According to the first embodiment, the intergate insulating film in the opening is not entirely etched when the intergate insulating film is opened, that is, a part of the intergate insulating film is left in the opening. Therefore, the charge storage layer is not damaged by overetching. Moreover, when the intergate insulating film between the charge storage layer and the control gate is dielectrically broken down, the intergate insulating film can be broken down by a minimum necessary breakdown voltage. Therefore, the tunnel oxide film between the semiconductor substrate and the charge storage layer can be less damaged.

As described above, according to the first embodiment, it is possible to electrically connect the control gate and the charge storage layer of the select gate transistor to each other without damaging the charge storage layer and the tunnel oxide film. It is also possible to test the electric connection of the control gate and the charge storage layer of the select gate transistor.

Second Embodiment

In the second embodiment, a die sort test different from the die sort test according to the first embodiment is described. As described above, this die sort test is a test for forming the conductive path between the control gate and the charge storage layer of the select gate transistor. The configuration is similar in other respects to the configuration according to the first embodiment.

Figure 6:
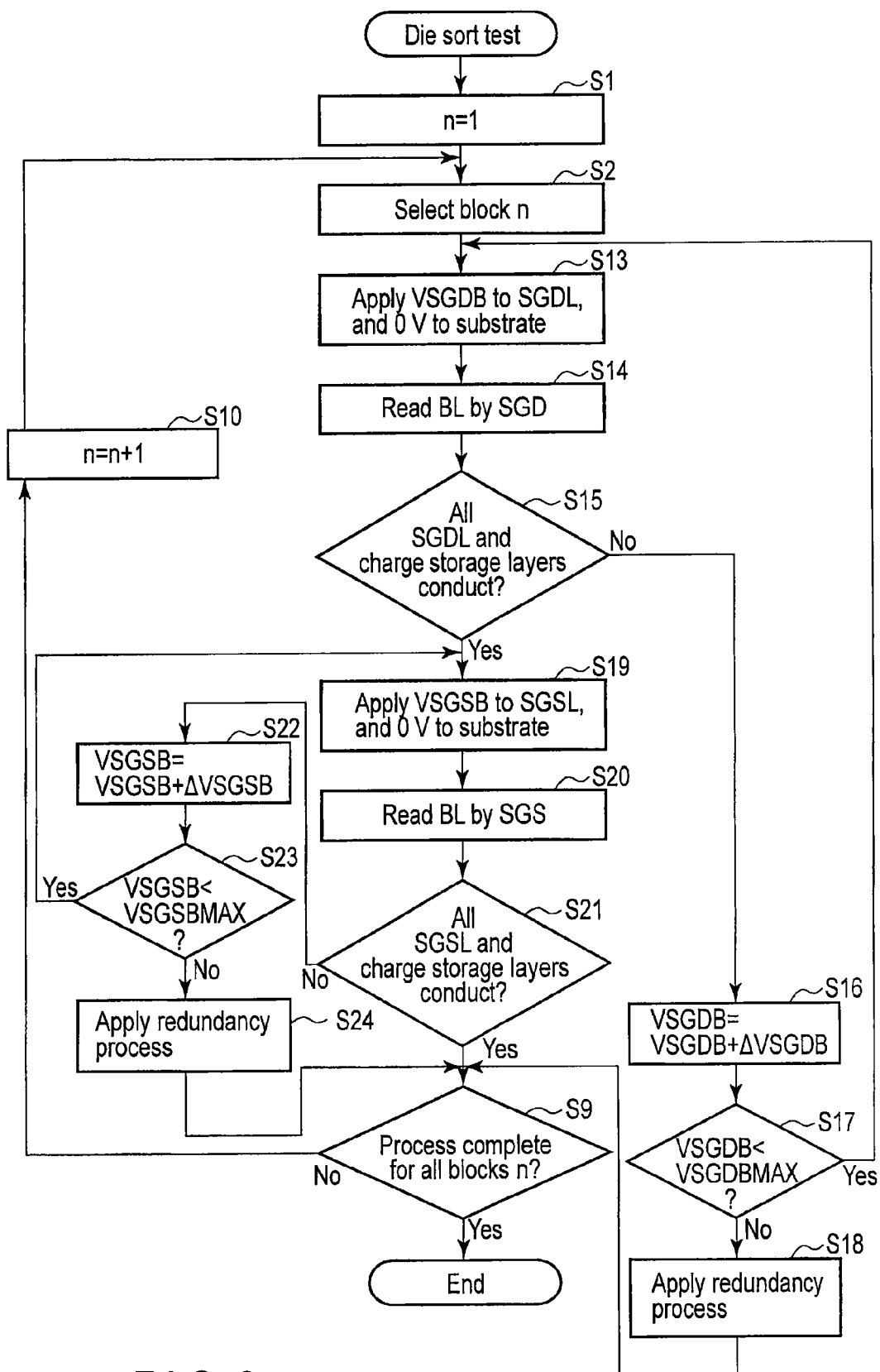
FIG. 6 is a flowchart of a die sort test according to a second embodiment.

FIG. 6 is a flowchart of the die sort test according to the second embodiment.

According to the second embodiment, breakdown voltages VSGDB and VSGSB for breaking down the intergate insulating film are applied to the control gates SGDL and SGSL, respectively. In a step of determining the conduction between the control gate and the charge storage layer, the select gate transistors SGD and SGS are then separately read.

First, n is set to 1 to select the block 1 at the time of die sorting (steps S1 and S2). The breakdown voltage VSGDB (for example, a pulse voltage of 5 V) for breaking down the intergate insulating film is then applied to the control gate SGDL of the select gate transistor SGD in the block 1, and a voltage of zero is applied to the semiconductor substrate (well) 10 (step S13).

It is then determined whether the control gates SGDL and the charge storage layers 32 of all the select gate transistors SGD in the block 1 are electrically continuous.

First, a voltage (for example, the voltage Vread) sufficient to switch on the memory cells MC is supplied to all the word lines WL in the block 1. The bit lines BL are precharged to the power supply voltage VDD. In this case, a voltage VSGS sufficient to switch on the select gate transistor SGS which is not read is supplied to the select gate transistor SGS (for example, VDD<VSGS<Vread). A voltage (for example, the power supply voltage VDD) that only switches on the select gate transistor SGD in which the control gate and the charge storage layer conduct and that does not switch on the select gate transistor SGD which fails to conduct and so increases its voltage because of coupling is then applied to the control gate SGDL of the select gate transistor SGD to be read.

As a result, the potential only drops in the bit line BL connected to the select gate transistor SGD in which the control gate SGDL and the charge storage layer are electrically continuous. By detecting the drop in potential of this bit line, it is possible to ascertain that the control gate SGDL and the charge storage layer are electrically continuous (step S14).

In this way, whether the control gates SGDL and the charge storage layers mutually conduct is determined for all the select gate transistors SGD in the block 1 (step S15).

If a select gate transistor SGD whose control gate and charge storage layer do not conduct exists, the breakdown voltage VSGDB to be applied to the control gate SGDL is stepped up by a voltage ΔVSGDB (step S16). For example, if the step-up voltage is 0.5 V, the breakdown voltage VSGDB is set to 5.5 V.

It is then determined whether the breakdown voltage VSGDB to be applied to the control gate SGDL is lower than an allowable maximum voltage (step S17). When the control gate and the charge storage layer are electrically continuous, the control gate SGDL and the charge storage layer 32 are at the same potential, and a large potential difference is produced between the charge storage layer 32 and the semiconductor substrate 10. The maximum breakdown voltage VSGDB that can be applied to the control gate SGDL is determined so that the potential difference will not cause the gate insulating film (for example, tunnel oxide film) 31 to break down.

When the breakdown voltage VSGDB is lower than the maximum voltage in step S17, the procedure returns to step S13, and the above-described processes in steps S13 to S17 are repeated. That is, the breakdown voltage VSGDB is applied to the control gate SGDL, and the bit line BL connected to the select gate transistor SGD is read. Thus, whether the control gates and the charge storage layers mutually conduct is determined for all the select gate transistors SGD in the block 1. When the control gates and the charge storage layers do not conduct, the breakdown voltage VSGDB is stepped up to the maximum voltage or more, and then the above-described processes in steps S13 to S17 are repeated.

On the other hand, if the breakdown voltage VSGDB is greater than or equal to the maximum voltage in step S17, it is determined that the control gate SGDL and the charge storage layer 32 of the select gate transistor SGD in this case cannot conduct. The select gate transistor SGD and the bit line BL connected to the select gate transistor are then regarded as defective, and a redundancy process is applied thereto. That is, the bit line BL connected to the select gate transistor SGD is replaced by a spare bit line BL. Otherwise, when the number of defective bit lines BL is great, this block is replaced by a spare block (step S18). The procedure then moves to step S9.

When it is ascertained in step S15 that the control gates SGDL and the charge storage layers of all the select gate transistors SGD conduct, the procedure moves to step S19.

In step S19, the breakdown voltage VSGSB (for example, a pulse voltage of 5 V) for breaking down the intergate insulating film is then applied to the control gate SGSL of the select gate transistor SGS in the block 1, and a voltage of zero is applied to the semiconductor substrate (well) 10 (step S19).

It is then determined whether the control gates SGSL and the charge storage layers 32 of all the select gate transistors SGS in the block 1 are electrically continuous.

First, a voltage (for example, the voltage Vread) sufficient to switch on the memory cells MC is supplied to all the word lines WL in the block 1. The bit lines BL are precharged to the power supply voltage VDD. In this case, a voltage VSGD sufficient to switch on the select gate transistor SGD which is not read is supplied to the select gate transistor SGD (for example, VDD<VSGD<Vread). A voltage (for example, the power supply voltage VDD) that only switches on the select gate transistor SGS in which the control gate and the charge storage layer conduct and that does not switch on the select gate transistor SGS which fails to conduct and so increases its voltage because of coupling is applied to the control gate SGSL of the select gate transistor SGS to be read. As a result, the potential only drops in the bit line BL connected to the select gate transistor SGS in which the control gate SGSL and the charge storage layer are electrically continuous. By detecting the drop in potential of this bit line, it is possible to ascertain that the control gate SGSL and the charge storage layer are electrically continuous (step S20).

In this way, whether the control gates SGSL and the charge storage layers mutually conduct is determined for all the select gate transistors SGS in the block 1 (step S21).

If a select gate transistor SGS whose control gate and charge storage layer do not conduct exists, the breakdown voltage VSGSB to be applied to the control gate SGSL is stepped up by a voltage ΔVSGSB (step S22). For example, if the step-up voltage is 0.5 V, the breakdown voltage VSGDB is set to 5.5 V.

It is then determined whether the breakdown voltage VSGSB to be applied to the control gate SGSL is lower than an allowable maximum voltage (step S23). When the control gate and the charge storage layer are electrically continuous, the control gate SGSL and the charge storage layer 32 are at the same potential, and a large potential difference is produced between the charge storage layer 32 and the semiconductor substrate 10. The maximum breakdown voltage VSGSB that can be applied to the control gate SGSL is determined so that the potential difference will not cause the gate insulating film (for example, tunnel oxide film) 31 to break down.

When the breakdown voltage VSGSB is lower than the maximum voltage in step S23, the procedure returns to step S19, and the above-described processes in steps S19 to S23 are repeated. That is, the breakdown voltage VSGSB is applied to the control gate SGSL, and the bit line BL connected to the select gate transistor SGS is read. Thus, whether the control gates and the charge storage layers mutually conduct are determined for all the select gate transistors SGS in the block 1. When the control gates and the charge storage layers do not conduct, the breakdown voltage VSGSB is stepped up to the maximum voltage or more, and then the above-described processes in steps S19 to S23 are repeated.

On the other hand, if the breakdown voltage VSGSB is greater than or equal to the maximum voltage in step S23, it is determined that the control gate SGSL and the charge storage layer 32 of the select gate transistor SGS in this case cannot conduct. The select gate transistor SGS and the bit line BL connected to the select gate transistor are then regarded as defective, and a redundancy process is applied thereto. That is, the bit line BL connected to the select gate transistor SGS is replaced by a spare bit line BL. Otherwise, when the number of defective bit lines BL is great, this block is replaced by a spare block (step S24). The procedure then moves to step S9.

When it is ascertained in step S21 that the control gates SGSL and the charge storage layers of all the select gate transistors SGS conduct, the procedure moves to step S9. Thus, the process for the block 1 ends.

It is then determined in step S9 whether the above-described process has been completed for all the blocks. If the process for all the blocks has not been completed, n is incremented (step S10), and the procedure returns to step S2. On the other hand, if the process for all the blocks has been completed, the process ends.

As a result of the die sort test described above, a conductive path is formed between the control gate and the charge storage layer in the select gate transistor, and whether the conductive path is formed can be determined.

According to the second embodiment, the select gate transistors SGD and SGS are separately read. It is thereby possible to inhibit the application of unnecessary stress to the tunnel oxide film of the select gate transistor in which the control gate and the charge storage layer conduct. The configuration and advantageous effects are similar in other respects to the configuration and advantageous effects according to the first embodiment.

Third Embodiment

In the third embodiment, a die sort test different from the die sort tests according to the first and second embodiments is described. As described above, this die sort test is a test for forming the conductive path between the control gate and the charge storage layer of the select gate transistor. The configuration is similar in other respects to the configuration according to the first embodiment.

In the first embodiment, the breakdown voltage for breaking down the intergate insulating film is applied to the control gate SGDL (SGSL), and then if a select gate transistor SGD (SGS) which cannot be read in the reading process exists, the breakdown voltage to be applied to its control gate SGDL (SGSL) is stepped up. In the third embodiment, the breakdown voltage is not stepped up, and the same level of a breakdown voltage is again applied. In this manner, it is possible to prevent a voltage that exceeds the dielectric strength voltage of the tunnel oxide film from being applied to the select gate transistor SGD (SGS). When the conduction between the control gates and the charge storage layers in all the select gate transistors SGD (SGS) cannot be ascertained even after the application of the breakdown voltage is repeated a predetermined number of loops, a redundancy process is conducted for the bit line BL connected to the select gate transistor having the gate the conduction of which cannot be ascertained.

Figure 7:
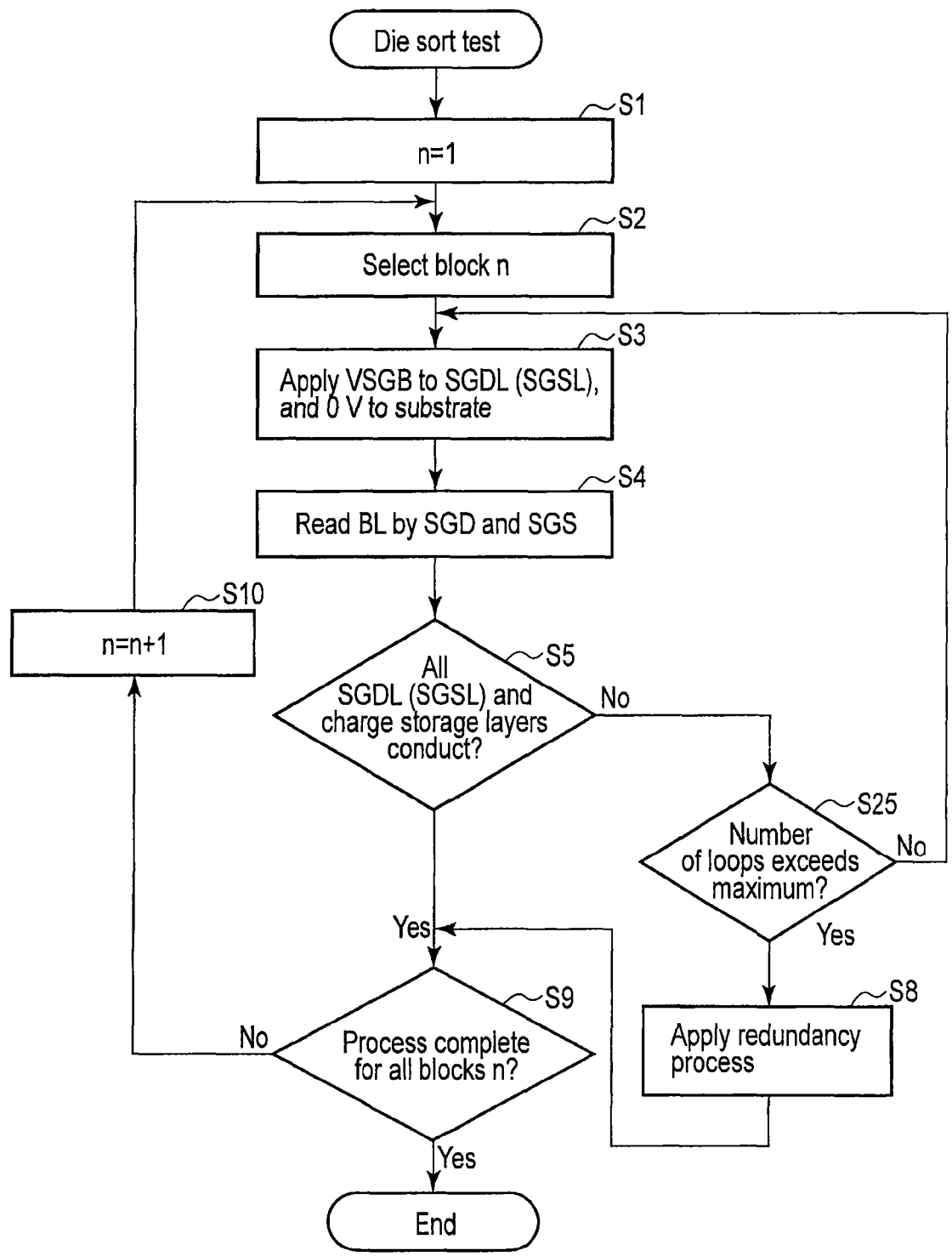
FIG. 7 is a flowchart of a die sort test according to a third embodiment.

FIG. 7 is a flowchart of the die sort test according to the third embodiment.

As in the first embodiment, after the processes in steps S1 to S4, whether the control gates SGDL (SGSL) and the charge storage layers mutually conduct is determined for all the select gate transistors SGD (SGS) in the block 1 (step S5).

If a select gate transistor SGD (SGS) whose control gate and charge storage layer do not conduct exists, the breakdown voltage VSGB is again applied to the control gate SGDL (SGSL) of the select gate transistor SGD (SGS). The application of the breakdown voltage VSGB is repeated a set number of loops until the conduction between the control gate and the charge storage layer is ascertained (steps S3 to S5 and S25).

If the number of loops has not exceeded the maximum in step S25, the procedure returns to step S3, and the above-described processes in steps S3 to S5 and S25 are repeated. That is, the breakdown voltage VSGB is applied to the control gate SGDL (SGSL), and the bit line BL connected to the select gate transistor is read. Thus, whether the control gates and the charge storage layers mutually conduct is determined for all the select gate transistors in the block 1. When the control gates and the charge storage layers do not conduct, the above-described processes in steps S3 to S5 and S25 are repeated until the number of application of the breakdown voltage VSGB exceeds the maximum.

On the other hand, if the number of loops has exceeded the maximum in step S25, it is determined that the control gate SGDL (SGSL) and the charge storage layer 32 of the select gate transistor SGD (SGS) in this case cannot conduct. The select gate transistor and the bit line BL connected to the select gate transistor are then regarded as defective, and a redundancy process is applied thereto. That is, the bit line BL connected to the select gate transistor is replaced by a spare bit line BL. Otherwise, when the number of defective bit lines BL is great, this block is replaced by a spare block (step S8). The procedure then moves to step S9.

When it is ascertained in step S5 that the control gates SGDL (SGSL) and the charge storage layers of all the select gate transistors SGD (SGS) conduct, the procedure moves to step S9. Thus, the process for the block 1 ends.

It is then determined in step S9 whether the above-described process has been completed for all the blocks. If the process for all the blocks has not been completed, n is incremented (step S10), and the procedure returns to step S2. On the other hand, if the process for all the blocks has been completed, the process ends.

As a result of the die sort test described above, a conductive path is formed between the control gate and the charge storage layer in the select gate transistor, and whether the conductive path is formed can be determined.

According to the third embodiment, when the intergate insulating film between the charge storage layer and the control gate is dielectrically broken down, the intergate insulating film can be broken down by a preset breakdown voltage that does not damage the tunnel oxide film between the semiconductor substrate and the charge storage layer. Therefore, it is possible to prevent the tunnel oxide film between the semiconductor substrate and the charge storage layer from being damaged. The configuration and advantageous effects are similar in other respects to the configuration and advantageous effects according to the first embodiment.

Fourth Embodiment

In the fourth embodiment, a die sort test different from the die sort tests according to the first, second, and third embodiments is described. As described above, this die sort test is a test for forming the conductive path between the control gate and the charge storage layer of the select gate transistor. The configuration is similar in other respects to the configuration according to the first embodiment.

Figure 8:
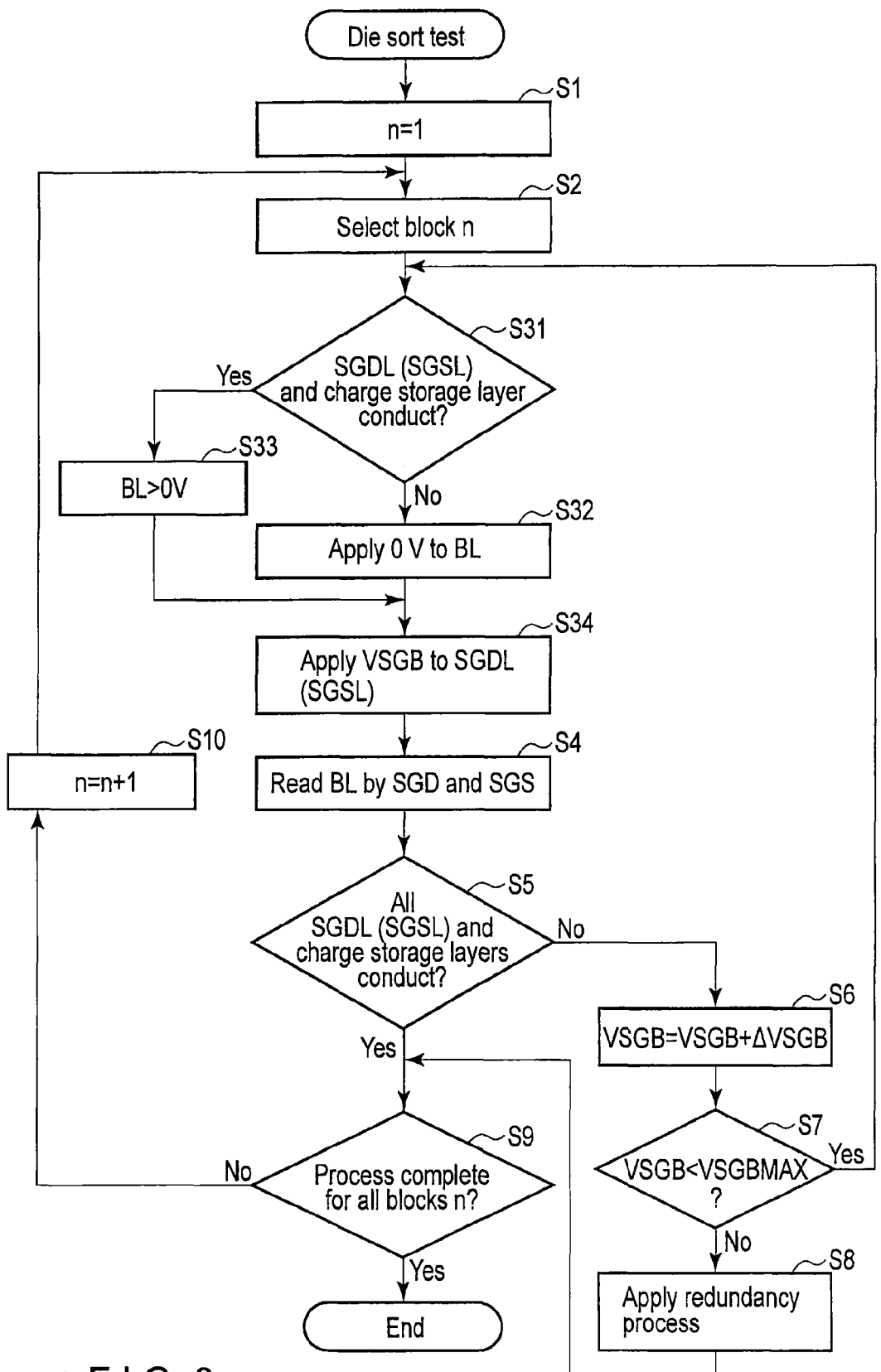
FIG. 8 is a flowchart of a die sort test according to a fourth embodiment.

FIG. 8 is a flowchart of the die sort test according to the fourth embodiment.

According to the fourth embodiment, in order to apply a potential difference across the control gate SGDL (SGSL) and the charge storage layer, a voltage of zero is applied not to the semiconductor substrate (well) but to the bit line BL.

First, n is set to 1 to select the block 1 at the time of die sorting (steps S1 and S2). It is then determined for the select gate transistor SGD (SGS) whether the control gate SGDL (SGSL) and the charge storage layer mutually conduct (step S31).

A voltage of zero is applied to the bit line BL for the select gate transistor SGD (SGS) in which the control gate and the charge storage layer do not conduct (step S32). On the other hand, a voltage greater than zero is applied to the bit line BL for the select gate transistor SGD (SGS) in which the control gate and the charge storage layer conduct (step S33). Here, a voltage greater than zero is a voltage serving as a potential difference that does not cause the tunnel oxide film to break down when the breakdown voltage VSGB for causing the intergate insulating film to break down is applied to the control gate. Steps S31 to S33 enable the breakdown voltage VSGB to be only applied to the intergate insulating film of the select gate transistor SGD (SGS) in which the control gate and the charge storage layer do not conduct.

The breakdown voltage VSGB (for example, a pulse voltage of 5 V) for breaking down the intergate insulating film is then applied to the control gate SGDL (SGSL) of the select gate transistor SGD (SGS) in the block 1 (step S34). In this case, if the breakdown voltage VSGB applied to the control gate SGDL (SGSL) is set to a voltage higher than the voltage that switches on the select gate transistor SGD (SGS) by coupling, the voltage of zero is transferred to the channel of the select gate transistor SGD (SGS) in which the control gate and the charge storage layer do not conduct. Accordingly, a potential difference is produced between the control gate SGDL (SGSL) and the charge storage layer 32. If this potential difference is of a magnitude that can cause the intergate insulating film (first insulating film 33A) to break down, the intergate insulating film between the control gate SGDL (SGSL) and the charge storage layer dielectrically breaks down, and the control gate SGDL (SGSL) and the charge storage layer 32 become electrically continuous.

It is then determined whether the control gates SGDL (SGSL) and the charge storage layers 32 of all the select gate transistors SGD (SGS) in the block 1 are electrically continuous.

First, a voltage (for example, a voltage Vread) sufficient to switch on the memory cells MC is supplied to all the word lines WL in the block 1. The bit lines BL are precharged to the power supply voltage VDD. A voltage (for example, the power supply voltage VDD) that only switches on the select gate transistor SGD (SGS) in which the control gate and the charge storage layer conduct and that does not switch on the select gate transistor SGD (SGS) which fails to conduct and so increases its voltage because of coupling is then applied to the control gate SGDL (SGSL).

As a result, the potential only drops in the bit line BL connected to the select gate transistor in which both the control gates SGSL and SGSL are electrically connected to the charge storage layer. By detecting the drop in potential of this bit line, it is possible to ascertain that the control gates SGSL and SGSL and the charge storage layer are electrically continuous (step S4).

In this way, whether the control gates SGDL (SGSL) and the charge storage layers mutually conduct is determined for all the select gate transistors SGD (SGS) in the block 1 (step S5).

If a select gate transistor SGD (SGS) whose control gate and charge storage layer do not conduct exists, the breakdown voltage VSGB to be applied to its control gate SGDL (SGSL) is increased, that is, stepped up by ΔVSGB (step S6). For example, if ΔVSGB is 0.5 V, the breakdown voltage VSGB is set to 5.5 V.

It is then determined whether the breakdown voltage VSGB to be applied to the control gate SGDL (SGSL) is lower than an allowable maximum voltage (step S7). When the breakdown voltage VSGB is lower than the maximum voltage, the procedure returns to step S31, and the above-described processes in steps S31 to S34 and S4 to S7 are repeated. That is, the breakdown voltage VSGB is applied to the control gate SGDL (SGSL), and the bit line BL connected to the select gate transistor SGS is read. Thus, whether the control gates and the charge storage layers mutually conduct is determined for all the select gate transistors in the block 1. When the control gates and the charge storage layers do not conduct, the breakdown voltage VSGB is stepped up to the maximum voltage or more, and then the above-described processes in steps S31 to S34 and S4 to S7 are repeated.

On the other hand, if the breakdown voltage VSGB is greater than or equal to the maximum voltage in step S7, it is determined that the control gate SGDL (SGSL) and the charge storage layer 32 of the select gate transistor SGD (SGS) in this case cannot conduct. The select gate transistor and the bit line BL connected to the select gate transistor are then regarded as defective, and a redundancy process is applied thereto. That is, the bit line BL connected to the select gate transistor is replaced by a spare bit line BL. Otherwise, when the number of defective bit lines BL is great, this block is replaced by a spare block (step S8). The procedure then moves to step S9.

When it is ascertained in step S5 that the control gates SGDL (SGSL) and the charge storage layers of all the select gate transistors SGD (SGS) conduct, the procedure moves to step S9. Thus, the process for the block 1 ends.

It is then determined in step S9 whether the above-described process has been completed for all the blocks. If the process for all the blocks has not been completed, n is incremented (step S10), and the procedure returns to step S2. On the other hand, if the process for all the blocks has been completed, the process ends.

As a result of the die sort test described above, a conductive path is formed between the control gate and the charge storage layer in the select gate transistor, and whether the conductive path is formed can be determined.

As described above, according to the first to fourth embodiments, the voltage applied across the control gate and the charge storage layer is increased, that is, stepped up in accordance with the electric connection between the control gate and the charge storage layer in the select gate transistor. Alternatively, a predetermined voltage is repeatedly applied across the control gate and the charge storage layer. Thus, it is possible to electrically connect the control gate and the charge storage layer of the select gate transistor to each other without damaging the charge storage layer and the tunnel oxide film, and provide a function that can test the connection.

In the first to third embodiments, the operation of applying the breakdown voltage VSGB for breaking down the intergate insulating film to the control gate and applying a voltage of zero to the semiconductor substrate is performed block by block. However, this operation may be simultaneously performed for all the blocks. This can reduce an inspection time. The reading process is then performed block by block.

In the third and fourth embodiments, the select gate transistors SGD and SGS may be read simultaneously or separately in the operation of ascertaining the conduction between the control gate and the charge storage layer.

In the second and fourth embodiments, the breakdown voltage may not be stepped up, and the same level of a breakdown voltage may be repeated a predetermined number of loops in the operation of stepping up the breakdown voltage for breaking down the intergate insulating film. In this manner, it is possible to prevent a voltage that exceeds the voltage resistance of the tunnel oxide film from being applied to the control gate.

When it is difficult in the manufacturing process to connect the control gate to the charge storage layer immediately under the control gate in the select gate transistor, the threshold of the select gate transistor may be changed by the injection of a charge to the charge storage layer and normal operation may not be performed if the select gate transistor is repeatedly switched on and off. By using the present embodiments, it is possible to electrically connect the control gate and the charge storage layer to each other stably in a test process. Consequently, a wrong operation caused by the change of the threshold of the select gate transistor can be inhibited.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a memory cell formed on a semiconductor substrate, the memory cell comprising
        a first gate insulating film formed on the semiconductor substrate,
        a first charge storage layer formed on the first gate insulating film,
        a first intergate insulating film formed on the first charge storage layer, and
        a first control gate formed on the first intergate insulating film; and
    a select gate transistor formed on the semiconductor substrate, the select gate transistor comprising
        a second gate insulating film formed on the semiconductor substrate,
        a first gate electrode formed on the second gate insulating film,
        a second intergate insulating film formed on the first gate electrode and having different first and second thicknesses, and
        a second control gate formed on the second intergate insulating film.

2. The device according to claim 1, wherein
the first thickness is the same as the thickness of the first intergate insulating film, and the second thickness is smaller than the first thickness.

3. The device according to claim 1, wherein
the first gate electrode has the same thickness as the first charge storage layer.

4. The device according to claim 1, wherein
the second intergate insulating film comprises stacked first and second films, the total thickness of the stacked first and second films comprises the first thickness, and the first film has the second thickness.

5. The device according to claim 4, wherein
the first film comprises a first insulating film disposed on the first gate electrode, and the second film comprises second and third insulating films disposed on the first insulating film.

6. The device according to claim 5, wherein
the first insulating film comprises a silicon nitride film, and the second and third insulating films comprise oxide films.

7. The device according to claim 4, wherein
the first film comprises first and second insulating films disposed on the first gate electrode in order, and the second film comprises third and fourth insulating films disposed on the second insulating film.

8. The device according to claim 7, wherein
the second insulating film comprises a silicon nitride film, and the first, third, and fourth insulating films comprise oxide films.

9. The device according to claim 1, further comprising:
a booster circuit which is connected to the select gate transistor and which generates a first voltage applied to the select gate transistor; and
a controller which steps up the first voltage applied to the second control gate of the select gate transistor in accordance with the electric connection between the first gate electrode and the second control gate of the select gate transistor.

10. The device according to claim 9, wherein
the controller holds the first voltage applied to the second control gate of the select gate transistor to a voltage that does not cause the second gate insulating film to break down.

11. The device according to claim 1, further comprising:
a booster circuit which is connected to the select gate transistor and which generates a first voltage applied to the select gate transistor; and
a controller which repeatedly applies the first voltage to the second control gate of the select gate transistor in accordance with the electric connection between the first gate electrode and the second control gate of the select gate transistor.

12. The device according to claim 1, further comprising:
a controller which changes the voltage of a bit line connected to the select gate transistor in accordance with the electric connection between the first gate electrode and the second control gate of the select gate transistor.

13. The device according to claim 1, wherein
a plurality of memory cells are connected in series, and the select gate transistors are disposed at both ends of the memory cells connected in series.

* * * * *